(12) United States Patent
Gilbert et al.

(10) Patent No.: US 10,298,265 B2
(45) Date of Patent: May 21, 2019

(54) LOW DENSITY PARITY CHECK DECODER

(71) Applicant: Imagination Technologies Limited, Kings Langley (GB)

(72) Inventors: Matthew Gilbert, Chepstow (GB); Henry Liu, Chepstow (GB); Adrian John Anderson, Chepstow (GB)

(73) Assignee: Imagination Technologies Limited, Kings Langley (GB)

( * ) Notice: Subject to any disclaimer, the term of this patent is extended or adjusted under 35 U.S.C. 154(b) by 277 days.

(21) Appl. No.: 14/978,987

(22) Filed: Dec. 22, 2015

(65) Prior Publication Data

US 2016/0191078 A1 Jun. 30, 2016

(30) Foreign Application Priority Data

Dec. 24, 2014 (GB) .................................. 1423194.8

(51) Int. Cl.
*H03M 13/00* (2006.01)
*H03M 13/11* (2006.01)
*H03M 13/37* (2006.01)

(52) U.S. Cl.
CPC .... *H03M 13/1128* (2013.01); *H03M 13/1111* (2013.01); *H03M 13/3707* (2013.01); *H03M 13/3723* (2013.01); *H03M 13/3746* (2013.01)

(58) Field of Classification Search
CPC .......... H03M 13/1128; H03M 13/1111; H03M 13/3746; H03M 13/3723; H03M 13/3707; H03M 13/1125; H03M 13/1117; H03M 13/1108; H03M 13/6331; G11C 11/5642; G11C 16/28; G11C 29/026; G11C 16/08; G11C 16/26; G11C 29/42; G11C 29/028; G11C 2029/4402
See application file for complete search history.

(56) References Cited

U.S. PATENT DOCUMENTS

| | | | |
|---|---|---|---|
| 8,769,380 B1 | 7/2014 | Burd et al. | |
| 9,866,241 B2 * | 1/2018 | Yen | H03M 13/1128 |
| 2010/0192040 A1 * | 7/2010 | Yedidia | H03M 13/1108 714/755 |
| 2011/0185264 A1 * | 7/2011 | Zeng | G11B 20/1833 714/780 |
| 2011/0320902 A1 | 12/2011 | Gunnam | |
| 2013/0305114 A1 * | 11/2013 | Olcay | H03M 13/1108 714/755 |
| 2014/0149826 A1 * | 5/2014 | Lu | G06F 11/108 714/764 |
| 2015/0149840 A1 * | 5/2015 | Alhussien | H03M 13/1125 714/719 |

(Continued)

Primary Examiner — Guerrier Merant
(74) Attorney, Agent, or Firm — Vorys, Sater, Seymour and Pease LLP; Vincent M DeLuca

(57) ABSTRACT

Methods and systems for decoding an LDPC encoded data block using first and second sets of decoding parameters. The method includes iteratively decoding the LDPC encoded data block using a first set of decoding parameters. The decoding progress is monitored to determine whether the decoding has reached a non-progressing state. If it is determined that the decoding has reached a non-progressing state the decoding is terminated and iterative decoding of the LDPC encoded data block is restarted using a second set of decoding parameters. The second set of decoding parameters is different from the first set of decoding parameters.

20 Claims, 11 Drawing Sheets

(56) References Cited

U.S. PATENT DOCUMENTS

| | | | | |
|---|---|---|---|---|
| 2015/0178154 A1* | 6/2015 | Kim | .................... | G06F 11/1048 |
| | | | | 714/758 |
| 2015/0244397 A1* | 8/2015 | Brown | ............... | H03M 13/1105 |
| | | | | 714/752 |
| 2015/0381206 A1* | 12/2015 | Fainzilber | .......... | H03M 13/1108 |
| | | | | 714/758 |
| 2016/0127037 A1* | 5/2016 | Cavaliere | ................ | H04L 1/005 |
| | | | | 398/25 |
| 2016/0179620 A1* | 6/2016 | Bazarsky | ............. | H03M 13/116 |
| | | | | 714/766 |

\* cited by examiner

LOW DENSITY PARITY CHECK DECODER

BACKGROUND

Low density parity check (LDPC) codes are linear error control codes with sparse parity check matrices and long block lengths that have been found to be an efficient method for transmitting messages over a noisy transmission channel while attaining performance near the Shannon limit. In particular, LDPC codes are used in many digital television standards (whether for terrestrial, satellite, cable or mobile use), such as DVB (Digital Video Broadcast)-T2, DVB-S2, DVB-C2, and China Terrestrial Television Broadcasting (CTTB), and other wireless standards, such as WiMax™ (IEEE 802.16) and some WiFi™ (IEEE 802.11.n) variants.

In general a message is encoded into a plurality of LDPC codes at a transmitter based on a parity check matrix and then transmitted across a channel. The LDPC codes are received at a receiver where an LDPC decoder attempts to decode each of the received LDPC codes using the parity check matrix. Most commercial LDPC decoders implement an iterative decoding technique based on the concept of belief propagation. In these techniques each single parity check (SPC) of the parity check matrix is decoded separately using soft-in-soft-out (SISO) techniques using message passing.

Instead of estimating the decoded message from the hard-decision value, each iteration involves estimating the codeword and performing parity checks on the estimated codeword. The output is a soft decision, which may be in the form of a Log-Likelihood Ratio (LLR). The sign of an LLR indicates whether a particular bit is more likely to be a "1" or "0" and the magnitude of the LLR represents the confidence or probability that the bit has the likely value. Generally, as more iterations are performed the number of failed parity checks decreases. However, since these decoding techniques implement a minimum searching technique, in many cases the decoder can get stuck within a local minimum and never converge to the correct codeword.

The embodiments described below are not limiting of implementations which solve any or all of the disadvantages of known LDPC decoding systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are methods and systems for decoding an LDPC encoded data block using first and second sets of decoding parameters. The method includes iteratively decoding the LDPC encoded data block using a first set of decoding parameters. The decoding progress is monitored to determine whether the decoding has reached a non-progressing state. If it is determined that the decoding has reached a non-progressing state the decoding is terminated and iterative decoding of the LDPC encoded data block is restarted using a second set of decoding parameters. The second set of decoding parameters is different from the first set of decoding parameters.

A first aspect provides a method of decoding an LDPC encoded data block, the method comprising: iteratively decoding, at an LDPC decoder, the LDPC encoded data block using a first set of decoding parameters; determining whether the decoding of the LDPC encoded data block using the first set of decoding parameters has reached a non-progressing state; and in response to determining that the decoding of the LDPC encoded data block using the first set of decoding parameters has reached a non-progressing state, terminating the decoding of the LDPC encoded data block using the first set of decoding parameters, and restarting iterative decoding, at the LDPC decoder, of the LDPC encoded data block using a second set of decoding parameters, the second set of decoding parameters being different from the first set of decoding parameters.

A second aspect provides a system configured to decode an LDPC encoded data block, the system comprising an LDPC decoder configured to iteratively decode the LDPC encoded data block using a first set of decoding parameters; and a control module configured to: determine whether the decoding of the LDPC encoded data block using the first set of decoding parameters has reached a non-progressing state; and in response to determining that the decoding of the LDPC encoded data block using the first set of decoding parameters has reached a non-progressing state, provide an indication to the LDPC decoder that the decoding of the LDPC encoded data block using the first set of decoding parameters has reached a non-progressing state; wherein the LDPC decoder is further configured to, in response to receiving the indication, terminate the decoding of the LDPC encoded data block using the first set of decoding parameters, and restart an iterative decode of the LDPC encoded data block using a second set of decoding parameters, the second set of decoding parameters being different from the first set of decoding parameters.

A third aspect provides a non-transitory computer readable storage medium having encoded thereon computer readable program code for generating a manifestation of the system of the second aspect.

The methods described herein may be performed by a computer configured with software in machine readable form stored on a non-transitory storage medium e.g. in the form of a computer program comprising computer readable program code for configuring a computer to perform the constituent portions of described methods or in the form of a computer program comprising computer program code adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

This acknowledges that firmware and software can be separately used and valuable. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figures 1A, 1B:
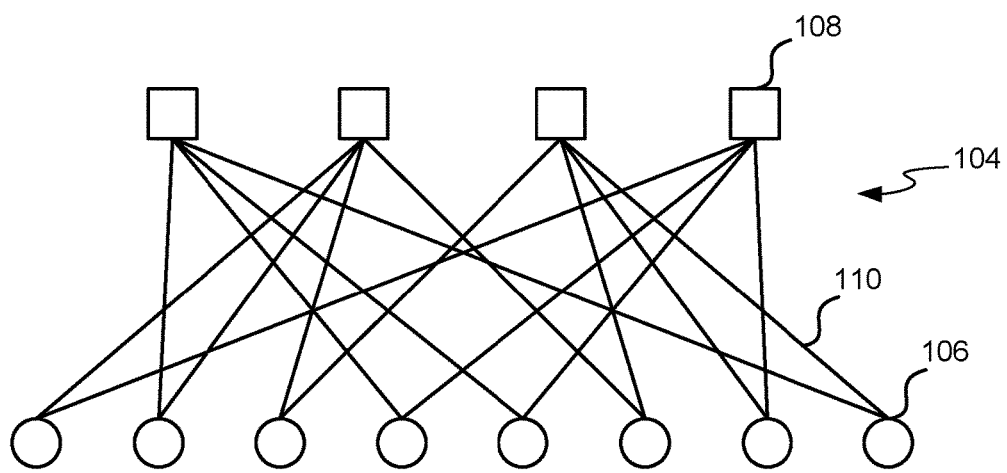
FIG. 1A is a diagram of an example parity check matrix.
FIG. 1B is a schematic diagram of a Tanner graph corresponding to the parity check matrix of FIG. 1A.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

The embodiments described herein relate to methods and systems for decoding LDPC encoded data blocks using first and second sets of decoding parameters. The method includes iteratively decoding a block of LDPC data using a first set of decoding parameters; detecting that the decoding has reached a non-progressing state (e.g. the number of failed parity checks is no longer decreasing); terminating the decoding using the first set of decoding parameters; and iteratively decoding the block of LDPC data using a second set of decoding parameters. In some embodiments, detecting that the decoding has reached a non-progressing state comprises detecting that the number of failed parity checks has not significantly decreased after a threshold number of iterations.

Restarting the decoding with a new set of parameters after it has been detected that the decoding has reached a non-progressing state provides a measurable performance improvement in certain situations allowing codewords that would not have been previously successfully decoded to be successfully decoded.

As described above, LDPC codes are linear error control codes with sparse parity check matrices and long block lengths that have been found to be an efficient method for transmitting messages over a noisy transmission channel. An LDPC code is represented by a parity-check matrix which describes the linear relations that the bits of a codeword must satisfy. In particular, a codeword c is in the linear code C if and only if the matrix vector product $Hc^T=0$ where H is the parity check matrix and $c^T$ is the transpose of the codeword c.

Each row of a parity check matrix, H, represents a parity check equation which defines linear combinations of bits of a codeword that must equal zero. Each parity check covers a different set of codeword bits and the parity bits have overlapping bits so that any one codeword bit is covered by more than one parity check. For example, in DVB-S2, where a 2/3 code rate is used each codeword information bit is covered by an average of eight parity checks.

The example parity matrix 102 of FIG. 1A (denoted "H") represents the following four parity check equations that must be satisfied for the vector ($c_1$, $c_2$, $c_2$, $c_3$, $c_4$, $c_5$, $c_6$, $c_7$, $c_8$) to be a codeword:

$c_2+c_4+c_5+c_8=0$ $c_1+c_2+c_3+c_6=0$ $c_3+c_6+c_7+c_8=0$ $c_1+c_4+c_5+c_7=0$

For a matrix to qualify as low density the number of ones in each column must be much less than the total number of parity checks and the number of ones in each row must be much less than the total number of bits in a codeword. A matrix meeting these requirements is thus a "sparse" parity check matrix.

Parity check matrices can also be represented by a Tanner Graph which is a bipartite graph. In a bipartite graph the nodes of the graph are divided into two distinctive sets and edges are only connecting nodes of two different types. FIG. 1B shows a Tanner graph 104 corresponding to the parity check matrix 102 of FIG. 1A. The Tanner graph 104 has bit nodes 106 and check nodes 108. Each bit node 106 corresponds to a bit in the codeword and each check node 108 corresponds to a parity check equation. A bit node is connected to a check node by an edge 110 if the corresponding bit forms part of the corresponding parity check equation. For example, the first parity check equation is a combination of bits 2, 4, 5, and 8 thus the first check node 108 is connected to the second, fourth, fifth and eighth bit nodes 106.

Figure 2:
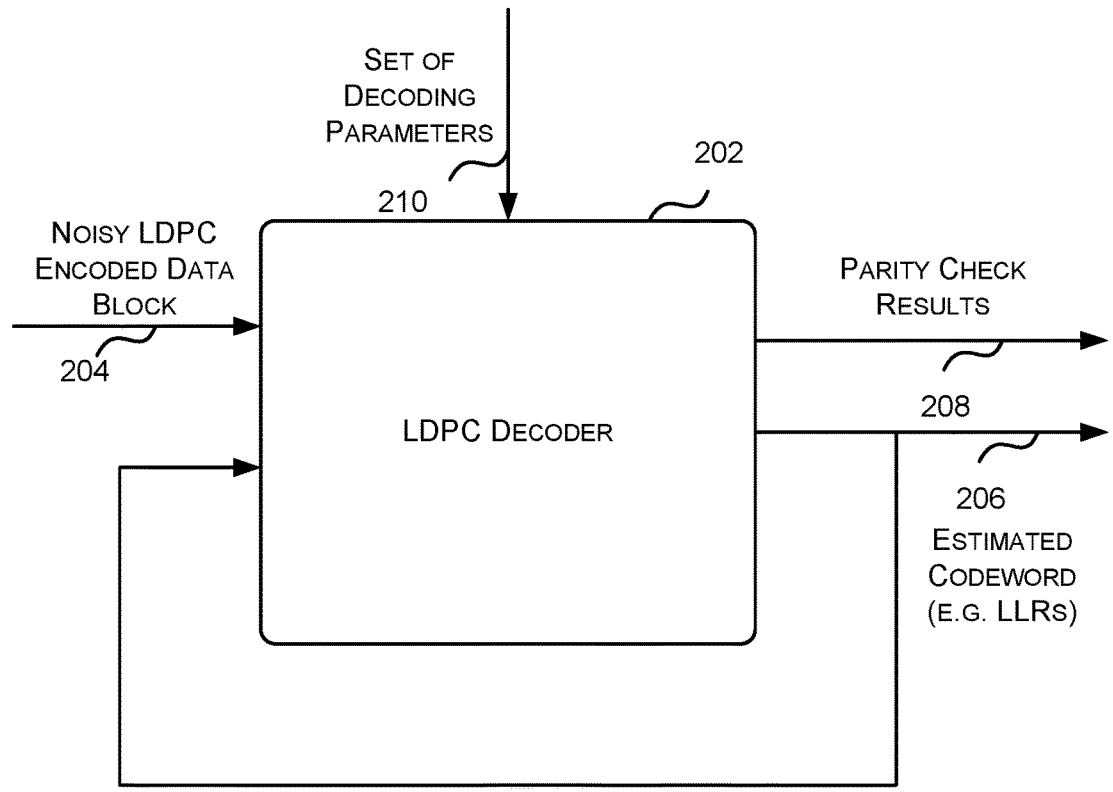
FIG. 2 is a block diagram of a conventional low-density parity check (LDPC) decoder.

Reference is now made to FIG. 2 which illustrates a conventional LDPC decoder 202 for decoding an LDPC encoded data block 204. In particular, the LDPC decoder 202 receives a data block that has been transmitted over a communications channel and thus may comprise one or more errors. As a result, the received LDPC encoded data block may be referred to herein as a noisy LDPC encoded data block 204. In some cases the noisy LDPC encoded data block may be in the form of a series or a vector of LLR (Log-Likelihood Ratio) values. An LLR value is the logarithmic ratio of the probability that a particular bit is a "1" and the probability that the particular bit is a "0". The sign of the LLR indicates whether the particular bit is estimated to be a "1" or a "0"; and the magnitude of the LLR indicates the confidence associated with the estimate. For example, in some cases if the LLR is positive then the bit is estimated to be a "1" and if the LLR is negative then the bit is estimated to be a "0". Where reverse logic is used a positive LLR may indicate the bit is estimated to be a "0" and a negative LLR may indicate the bit is estimated to be a "1". Typically the larger the LLR, the more confidence there is in the estimate (i.e. the higher the probability that the estimate is correct). Accordingly the LLR value indicates both the estimated value of the bit (i.e. "1" or "0") and the confidence associated with the estimate.

The LDPC decoder 202 generates an estimate of the codeword 206 the data block 204 represents through an iterative process based on the parity matrix used to encode the data. In particular, each iteration the LDPC decoder 202 generates an estimate of the codeword 206 which is fed back into the LDPC decoder 202 to update the estimate.

In some cases the LDPC decoder 202 may implement an iterative decoding technique based on the concept of belief propagation. In these techniques each parity check equation is decoded separately using soft-in-soft-out (SISO) techniques using message passing.

An example SISO method can be described with reference to the Tanner graph 104 of FIG. 1B. In particular, each bit node 106 is responsible for estimating the value of the corresponding bit and each check node 108 is responsible for assessing a particular parity check equation. An LDPC encoded data block is iteratively decoded into a codeword by passing messages back and forth between the bit nodes 106 and the parity check nodes 108.

The method starts with each bit node 106 generating probabilities that the corresponding bit is a "1" or a "0". A message is then sent to the appropriate parity check nodes 108 with these probabilities. For example, a message may include information that says bit 1 has a 90% probability of being a "1" and a 10% probability of being a "0".

Each check node 108 performs a parity check based on the received probabilities and sends a message back to each connected bit node 106 indicating a probability that the bit is a "1" and a probability that the bit is a "0". For example, if a check node is connected to four bit nodes, and it receives messages from three of the bit nodes indicating their corresponding bits have a high probability of being "0", "0" and "1" respectively then the check node may send a message to the fourth bit node indicating the corresponding bit has a high probability of being a "1" (so that the sum of the four bits will be even). The actual probability may be based on the probabilities received from the other bit nodes. For example, the higher the probabilities that the other three bits are "0", "0" and "1" respectively, the higher the probability the fourth bit is a "1".

When the bit nodes 106 receive the messages back from the check nodes 108 they update their probabilities accordingly. For example, each bit node may combine (e.g. sum, scale or average) the probabilities received from each connected check node and use this combined value to update the probability values. The process is then repeated with the bit nodes 106 providing their updated probability information to the check nodes 108.

Accordingly, each iteration involves estimating the codeword 206 and performing parity checks on the estimated codeword 206 to produce parity check results 208. In some cases the estimated codeword 206 is represented by a vector of LLR values where each LLR value provides an estimate of the value of a respective bit of the codeword (e.g. whether it is a "1" or a "0") and a confidence associated with the estimate.

The parity check results 208 indicate the number of failed parity checks. In some cases the parity check results 208 may be implemented as a bit vector comprising one bit for each parity check. In some examples when the bit is set to "1" it may indicate that the corresponding parity check failed and when the bit is set to "0" it may indicate that the corresponding parity check was successful. In other cases the parity check results 208 may be a value indicating the number of failed parity checks.

Figure 3:
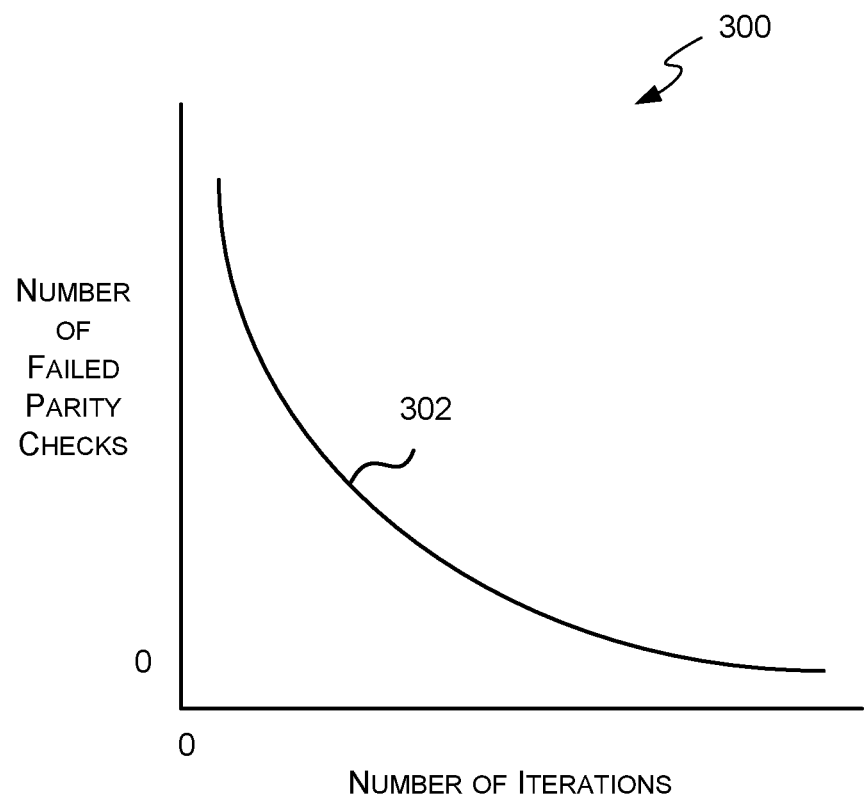
FIG. 3 is a graph showing the relationship between the number of failed parity checks and the number of iterations for a successful decode.

Generally, for a decodable codeword with detectable and removable noise, as more iterations are performed the number of failed parity checks decreases. This is illustrated in the graph 300 of FIG. 3 which shows a curve 302 depicting the relationship between the number of failed parity checks and the number of iterations for a successful decode. It can be seen that as more iterations are performed the number of failed parity checks converges to zero indicating a successful decode.

The LDPC decoder 202 may be designed to stop the iterative process when there are no failed parity checks or when a predetermined number of iterations have been performed. In some cases the maximum number of iterations is determined from the maximum time that can be taken to decode the data block.

Figure 4:
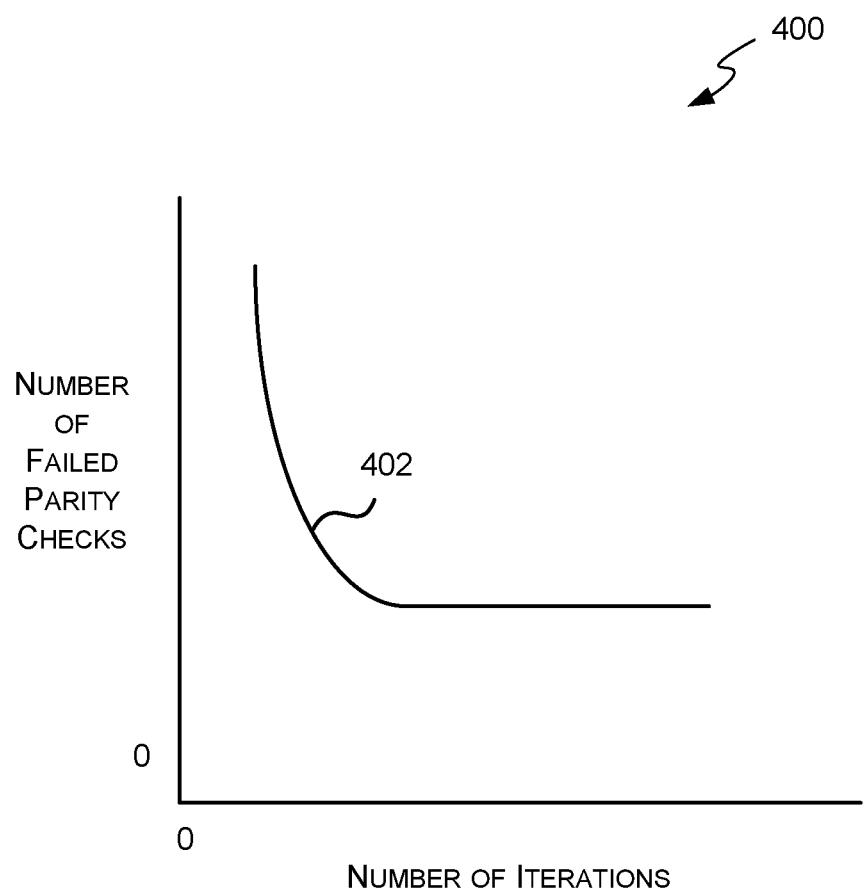
FIG. 4 is a graph showing the relationship between the number of failed parity checks and the number of iterations for an unsuccessful decode.

However, since the described decoding techniques implement a minimum searching technique, in some cases the LDPC decoder can get stuck within a local minimum and never converge to the correct codeword. This is illustrated in the graph 400 of FIG. 4 which shows a curve 402 depicting the relationship between the number of failed parity checks and the number of iterations for an unsuccessful decode. It can be seen that as more iterations are performed the curve 402 plateaus and never reaches zero failed parity checks. Since the number of failed parity checks never reaches zero the data block is not successfully decoded.

When the decoding reaches the point where the output is no longer improving (e.g. the number of failed parity checks is not decreasing) the decoding is said to be in a non-progressing state because subsequent iterations are not moving the estimated codeword closer to the correct solution.

The LDPC decoder 202 is designed to use a set of decoding parameters 210 when decoding a received data block. The set of decoding parameters 210 control the gradient and shape of the curve 302 and thus dictate how quickly the LDPC decoder 202 will identify the correct code from the received data block. Where the estimated codeword 206 generated by the LDPC decoder 202 is represented by a series or vector of LLRs the set of decoding parameters may specify how the LLRs are modified each iteration. For example, the set of decoding parameters 210 may include an offset value and a difference value which shifts and scales the LLR as described in equation (1):

$$LLR_{new} = \frac{LLR_{previous} - \text{offset}}{\text{difference}} \quad (1)$$

The decoding parameters are empirically determined for a particular channel and code rate using exhaustive testing to achieve the best decode accuracy. Accordingly, the set of decoding parameters 210 is typically fixed in the LDPC decoder 202 for a particular channel and code rate.

Figure 5:
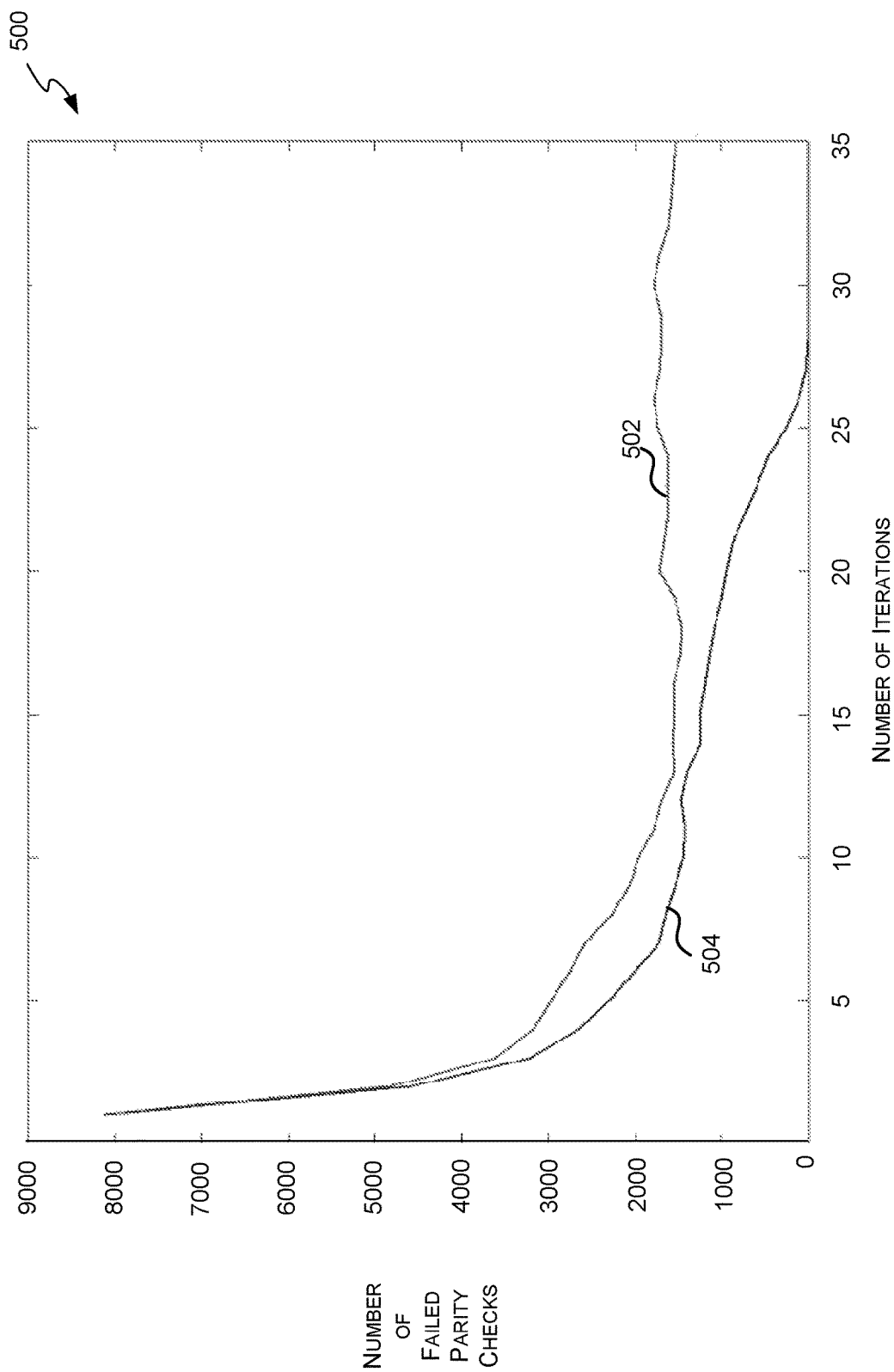
FIG. 5 is a graph showing the relationship between the number of failed parity checks and the number of iterations when two different sets of decoding parameters are used to decode the same data block.

Although the LDPC decoder 202 is configured to use a particular set of decoding parameters that has been empirically shown to produce the best overall decode accuracy for the particular channel and code rate, there are some data blocks that cannot be correctly decoded using this set of decoding parameters, but can be correctly decoded using a secondary set of decoding parameters. This is illustrated in the graph 500 of FIG. 5. In particular, the graph 500 of FIG. 5 shows two curves 502 and 504. The first curve 502 shows the relationship between the number of failed parity checks and the number of iterations when a particular data block is decoded using a first or primary set of decoding parameters and the second curve 504 shows the relationship between the number of failed parity checks and the number of iterations where the same data block is decoded using a second or secondary set of decoding parameters. The second or secondary set of decoding parameters may be empirically identified as providing the second best decoding performance. For example, an offset of eight and difference of thirty-two may be an optimal set of decoding parameters for most codewords, but is unable to correctly decode certain "tricky" codewords. However, an offset of twelve and a difference of twenty-four may be a sub-optimal set of decoding parameters for most codewords, but it may be able to decode the "tricky" codewords.

It can be seen from the first curve 502 that when the first or primary set of decoding parameters are used to decode the particular data block the number of failed parity checks plateaus before it reaches zero and thus the data is not correctly decoded. However, when the second or secondary set of decoding parameters is used it can be seen from the second curve 504 that the number of failed parity checks eventually falls to zero indicating a successful decode. As a result, when decoding using a first or primary set of decoding parameters has reached a non-progressing state it may be beneficial to restart the decoding using a second or secondary set of decoding parameters.

Accordingly, the embodiments described herein relate to methods and systems for decoding an LDPC encoded data block which involves decoding a data block using a first set of decoding parameters, detecting if the decoding reaches a state where it is no longer progressing, and if so, terminating the decoding, and restarting the decoding with a second or secondary set of parameters.

Figure 6:
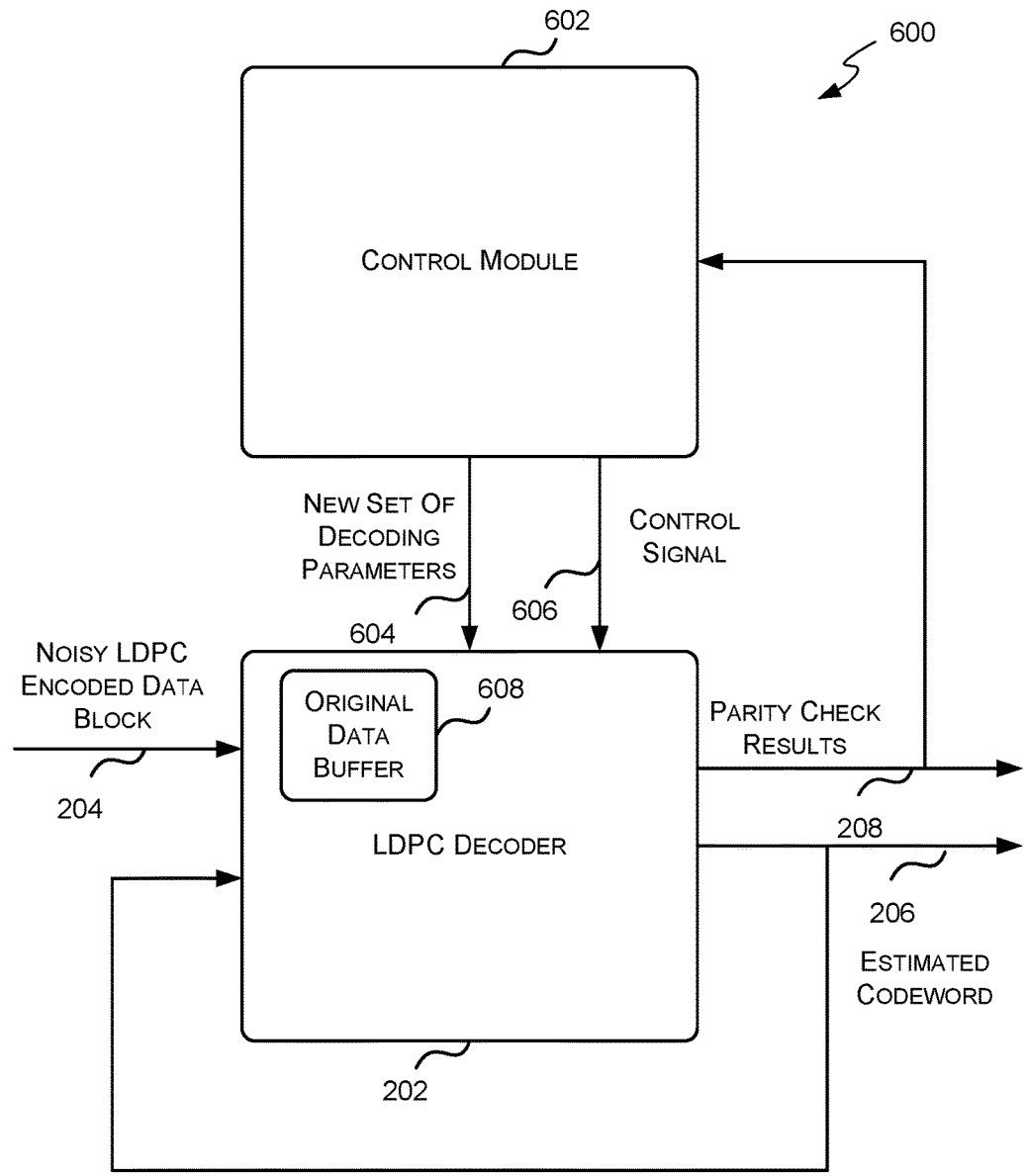
FIG. 6 is a block diagram of a system for decoding LDPC encoded data blocks where when it is detected that the LDPC decoder is in a non-progressing state decoding is terminated and restarted with a new set of decoding parameters.

Reference is now made to FIG. 6 which shows an example system 600 for decoding LDPC encoded data blocks using multiple sets of decoding parameters.

The system 600 comprises the LDPC decoder 202 of FIG. 2 and a control module 602. The control module 602 is configured to control the operation of the LDPC decoder 202 to cause the LDPC decoder to switch to using a secondary set of decoding parameters when it is detected that a data block is unlikely to be decoded using the first or primary set of decoding parameters (e.g. the decoding of the data block using a first set of primary is no longer progressing).

In particular, the control module 602 is configured to monitor the parity check results of each iteration and detect when the decoding using the first or primary set of decoding parameters is in a non-progressing state based on the parity check results. In some cases the control module 602 may be configured to detect that the decoding is in a non-progressing state when the number of failed parity checks has not significantly decreased after a threshold number of iterations. An example method for detecting when the decoding is in a non-progressing state will be described with reference to FIG. 11.

If the control module 602 detects that the decoding using the first or primary set of decoding parameters has reached a non-progressing state, the control module 602 provides the LDPC decoder 202 with a new set of decoding parameters 604 (e.g. a second or secondary set of decoding parameters) and transmits a control signal 606 to the LDPC decoder 202 to terminate decoding using the first or primary set of decoding parameters and restart the decoding with the new set of decoding parameters 604. An example implementation of the control module 602 will be described with reference to FIG. 9.

Upon receiving the control signal 606, the LDPC decoder 202 terminates the current decoding, loads the new set of decoding parameters 604 and restarts the decoding using the new set of decoding parameters 604. In particular, the LDPC decoder 202 restarts the decoding using the new set of decoding parameters from the initial noisy LDPC encoded data block 204, not the current codeword estimate.

In some cases the LDPC decoder 202 may include a buffer 608 or a set of buffers for storing the original data block so that the original noisy LDPC encoded data block 204 does not have to be reloaded when the decoding is restarted with the second set of decoding parameters. This can significantly speed up the process of restarting the decoding since the data blocks can be quite large. For example, second generation Digital Video Broadcasting (DVB) standards, such as DVB-T2, DVB-S2 and DVB-C2 have blocks of 64,000 bits.

The LDPC decoder 202 and the control module 602 are shown in FIG. 6 as being distinct components, for purposes of explanation. In other examples, the control module may be integrated into the LDPC decoder so that the LDPC decoder 202 performs self-monitoring and detection. However, a system, such as that shown in FIG. 6, with a dedicated control module 602 may provide performance benefits over a system where the LDPC decoder 202 performs the analysis. In particular, a dedicated control module may be able to analyze the parity check results and generate the control signal to continue decoding with the current set of decoding parameters or to terminate and restart very quickly, enabling decoding of the received signal in real time. In other words because the control module 602 can generate the control signal so quickly at the end of an iteration it provides the LDPC decoder 202 enough time to accurately decode a codeword before the next codeword is received (e.g. time is not wasted waiting for a control signal).

Furthermore, although system 600 shows that the control module 602 provides the new set of decoding parameters to the LDPC decoder 202, in other examples the LDPC decoder 202 may store multiple sets of decoding parameters and the LDPC decoder determines which set of decoding parameter set to use based on the control signal 606 received from the control module 602.

Figure 7:
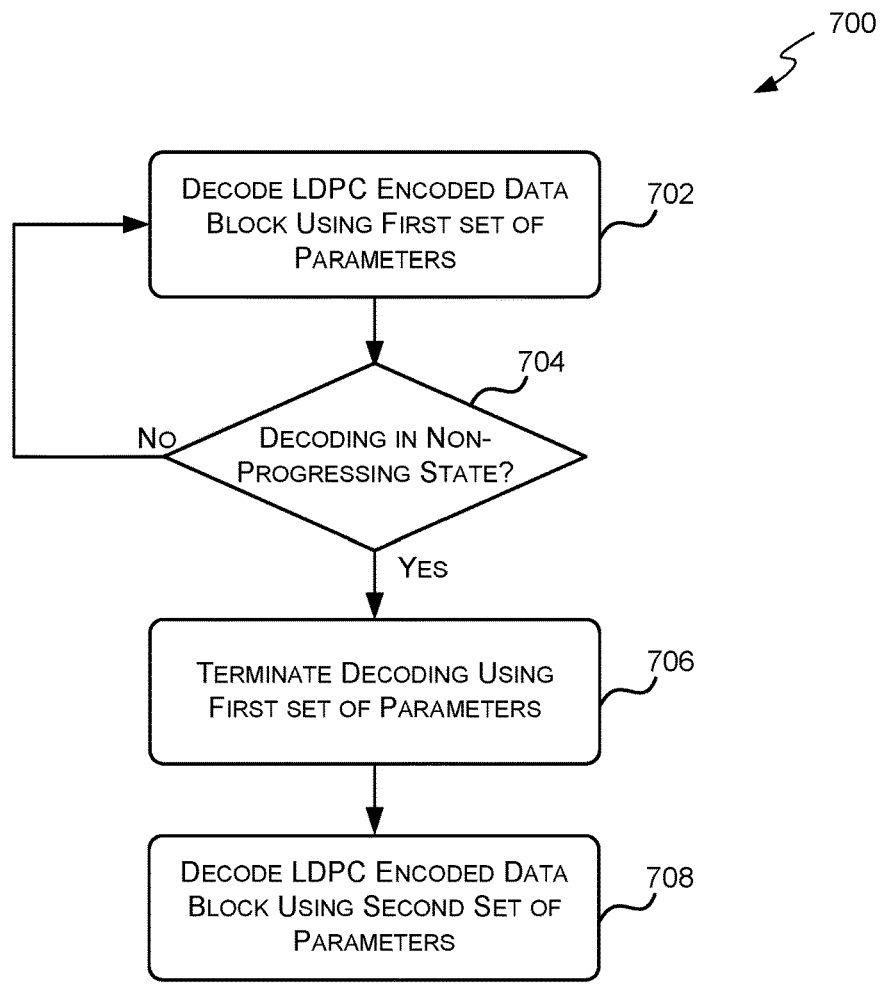
FIG. 7 is a flow chart of a method for decoding an LDPC encoded data block using the system of FIG. 6.

Reference is now made to FIG. 7 which shows an example method 700 for decoding an LDPC encoded data block which may be executed by the system 600 of FIG. 6. The method 700 begins at block 702 where the LDPC decoder 202 decodes an LDPC encoded data block 204 using a first or primary set of decoding parameters for a predetermined period. The first predetermined period may be a number of iterations (e.g. one iteration) or a unit of time. Since it is generally beneficial to detect a non-progressing state as soon as possible to maximize the amount of time that can be spent using the second set of parameters, a smaller period such as a single iteration may provide improved performance. Furthermore, the overhead of performing the analysis is minimal compared to the overhead of a decode iteration. Accordingly, performance benefits can be achieved by performing the analysis more often and reducing the number of iterations of the first decode attempt (i.e. the decode using the first or primary set of decoding parameters).

As described above, the first or primary set of decoding parameters may be empirically determined to produce the best overall decoding success rate. However, in other cases the initial decoding may be done using a sub-optimal set of decoding parameters. Once the decoding using the first set of decoding parameters has been performed for the predetermined period the method 702 proceeds to block 704.

At block 704 it is determined whether the decoding using the first set of decoding parameters is in a non-progressing state. As described above, decoding is said to be in non-progressing state when subsequent iterations of the decoding algorithm do not produce a better estimate of the codeword. The quality of an estimated codeword may be based on the number of failed parity checks for that codeword. In particular, the lower the number of failed parity checks, the better the estimate of the codeword. A correct estimate has zero failed parity checks. Since a non-progressing state may be caused by the decoding algorithm being stuck on a local minimum a non-progressing state may also be referred to herein as a stuck state.

In some cases a non-progressing state may be identified when the number of failed parity checks does not significantly decrease after a threshold number of consecutive iterations. In examples where the system includes a control module the control module may monitor the number of failed parity checks and send a control message to the LDPC decoder when it detects a non-progressing state. In examples where the system does not include a control module then the LDPC decoder itself may monitor the number of failed parity checks to determine whether the decoding is in a non-progressing state.

If it is determined that the decoding is not in a non-progressing state (e.g. it is in a progressing state in which the output (e.g. estimated codeword) is improving) then the method 700 proceeds back to block 702 where the LDPC decoder continues decoding the LDPC encoded data block using the first set of decoding parameters. If, however, it is determined that the decoding is in a non-progressing state then the method 700 proceeds to block 706.

At block 706, once the LDPC decoder 202 has determined that the decoding is in a non-progressing state, either by receiving a control message from a control module or by detecting itself that a non-progressing state has occurred, the LDPC decoder 202 terminates decoding the LDPC encoded data block using the first set of decoding parameters. Once the decoding has been terminated the method 700 proceeds to block 708.

At block 708, the LDPC decoder 202 restarts the decoding of the LDPC encoded data block from the original noisy LDPC encoded data block using a second or secondary set of decoding parameters. More particularly, the LDPC decoder 602 does not start from the most recent codeword estimate from the initial decode attempt (e.g. the decoding using the first set of decoding parameters).

The second or secondary set of decoding parameters is different from the first or primary set of decoding parameters used in block 702. As described above, in some examples the second or secondary set of decoding parameters is empirically determined to be the second best set of decoding parameters for the particular channel and code rate in terms of decoding success rate. However, in other examples other parameter sets may be used.

The decoding of the LDPC encoded data block using the second or secondary set of decoding parameters may continue until the number of failed parity checks is zero or until a predetermined number of iterations have been performed. In some cases there is a maximum amount of time allotted for decoding each data block. For example, where the LDPC decoder is used to decode a real-time stream the decoding has to keep up with the bitrate of the data being decoded. In particular, each codeword has to be decoded before the next codeword is received. In these cases the predetermined number of iterations may be selected to ensure that the maximum decode time is not exceeded.

When the initial decode attempt using the first or primary set of decoding parameters reaches a non-progressing state and a second decode attempt is made using the second or secondary set of decoding parameters, the total number of iterations over both attempts may be limited (i.e. the total number of iterations performed to decode the data block may be limited). Therefore the number of iterations available for the second decode attempt (the attempt using the second or secondary set of decoding parameters) may be based on the number of iterations performed during the initial attempt. To give the second attempt the best possible chance (e.g. the most iterations) of successfully decoding the data block, it is beneficial to detect that the first attempt is in a non-progressing state as soon as possible.

However, in some examples the LDPC decoder may be configured to allow the total number of iterations over both attempts to extend beyond the maximum number of iterations on the assumption that it is likely that the decoding of the subsequent codeword will require less than the maximum number of iterations. In these cases it is the aggregate throughput that is designed to keep up with the bitrate of the data being decoded, not each individual codeword decode.

In some cases the LDPC decoder 202 may be configured to complete one iteration and then wait for feedback (e.g. a control signal) from the control module 602 indicating what to do next (e.g. to complete the next iteration using the current set of decoding parameters or to terminate the decoding and restart with a new set of decoding parameters). In these cases, where the control module 602 detects that the decoding is not in a non-progressing state (e.g. it is in a progressing state) the control module 602 may generate a control signal to cause the LDPC decoder 202 to continue decoding using the current set of decoding parameters.

The method 700 of FIG. 7 may be repeated with further sets of decoding parameters. For example, if it is detected that the second decode attempt (the decoding using the second set of decoding parameters) has reached a non-progressing state then the second decode attempt may be terminated and a third decode attempt may be started using a third set of decoding parameters and so on. However, many applications which use LDPC coding require that the encoded data blocks (e.g. frames) be decoded within a certain period of time (e.g. before the next frame arrives) which does not typically provide enough time for a third decode attempt (e.g. decoding using a third set of decoding parameters) to converge to the correct codeword (e.g. reach zero failed parity checks).

Figure 8:
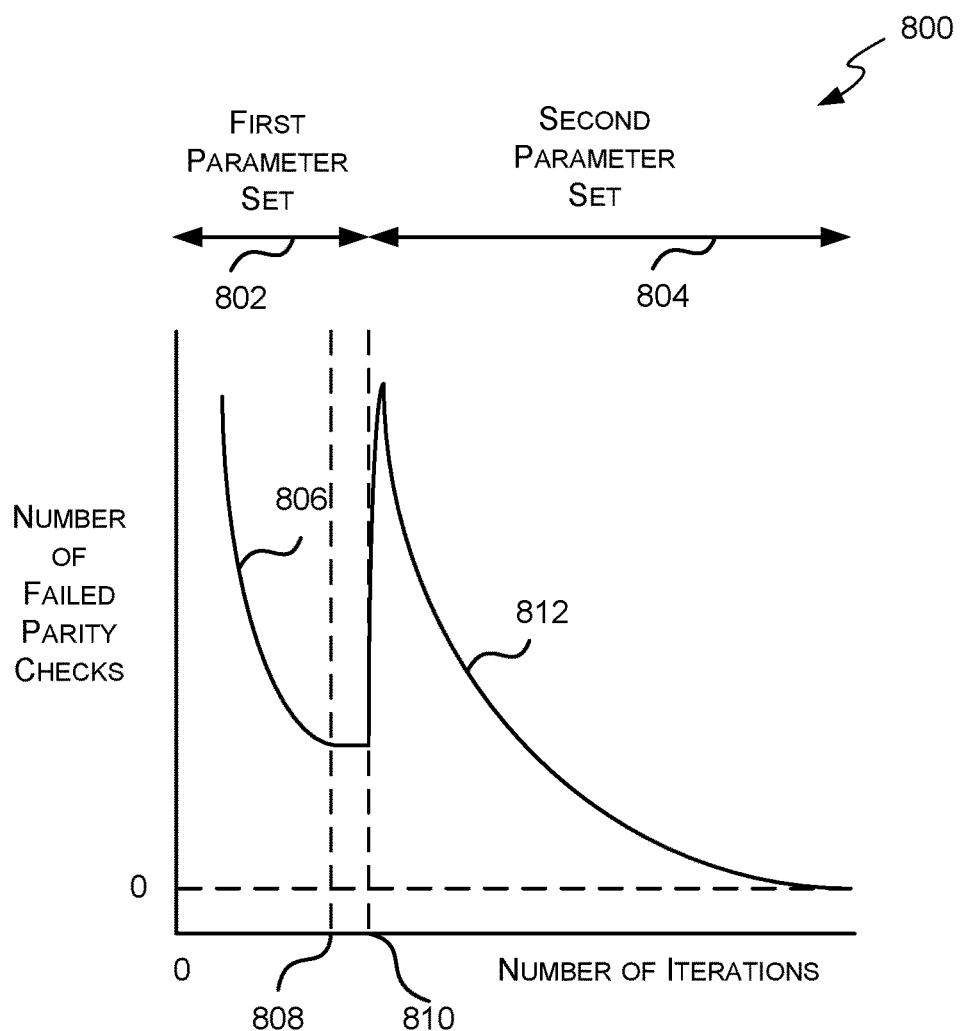
FIG. 8 is a graph illustrating the relationship between the number of failed parity checks and the number of iterations when an LDPC encoded data block is decoded using the method of FIG. 7.

Reference is now made to FIG. 8 which shows a graph 800 illustrating the relationship between the number of failed parity checks and the number of iterations when decoding an LDPC encoded data block in accordance with the method 700 of FIG. 7. It can be seen that the decoding is divided into two distinct periods 802 and 804. In the first period 802 the LDPC decoder attempts to decode the data block using the first or primary set of decoding parameters and in the second period 804 the LDPC decoder attempts to decode the data block using a second, different set, of decoding parameters.

During the first period 802 it can be seen from the curve 804 that the decoding is initially in a progressing state (i.e. the number of failed parity checks is decreasing), but then at iteration 808 the number of failed parity checks plateaus and thus the decoding enters a non-progressing state. The non-progressing state may be detected, for example, by the control module 602 or the LDPC decoder 202 itself, at iteration 810. This causes the LDPC decoder to terminate the decode attempt using the first set of decoding parameters and restart a new decode attempt using the second set of decoding parameters. Since the second decode attempt starts afresh from the original noisy LDPC encoded data block it can be seen in curve 812 that the number of failed parity checks initially jumps up, but quickly comes down until the number of failed parity checks equals zero (indicating a successful decode).

As described above, where a maximum number of iterations performed for each data block is provided the sum of the number of iterations performed in the first period 802 and the number of iterations performed in the second period 804 must be less than or equal to the specified maximum number of iterations. For example, if the maximum number of iterations is 10, and 4 iterations are performed in the first period 802 then only 6 iterations can be performed in the second period 804.

Figure 9:
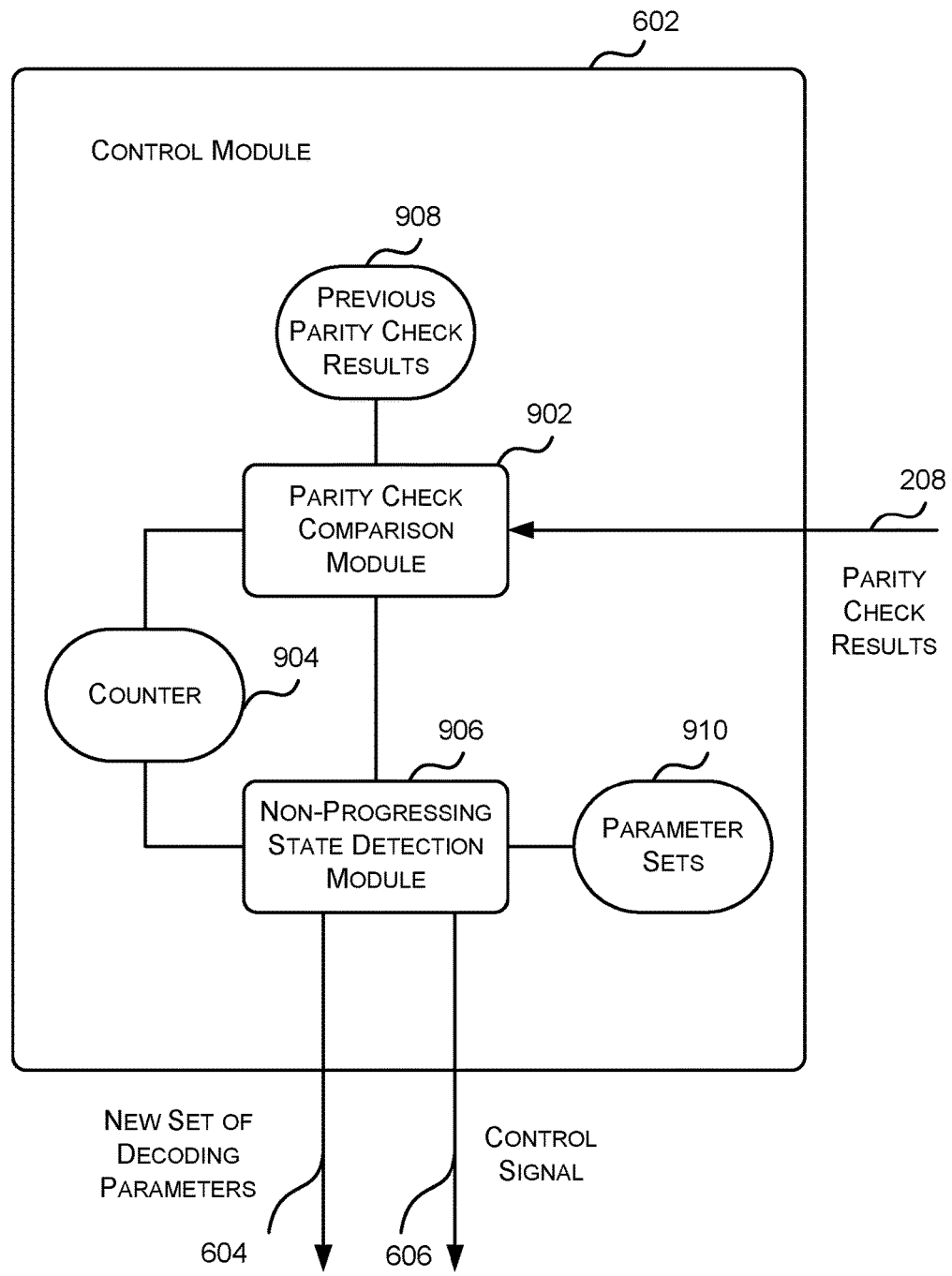
FIG. 9 is a block diagram of an example implementation of the control module of FIG. 6.

Reference is now made to FIG. 9 which illustrates an example implementation of the control module 602 of FIG. 6. As described above, the control module 602 is responsible for controlling operation of the LDPC decoder 202. In particular, the control module 602 monitors the output of the LDPC decoder and if it detects that an initial decode attempt using a first set of decoding parameters is in a non-progressing state it causes the LDPC decoder to terminate the first attempt and start a new decode attempt using a second set of parameters.

The control module 602 of FIG. 9 comprises a parity check comparison module 902 for detecting and tracking, using a counter 904, whether the number of failed parity checks is significantly decreasing; and a non-progressing state detection module 906 for determining whether the decoding is in a non-progressing state based on the counter 904.

The parity check comparison module 902 is configured to keep track of the number of consecutive iterations in which the number of failed parity checks does not decrease by more than a threshold amount. In particular, the parity check comparison module 902 compares the received parity check results 208 for the most recent iteration of the decode attempt using the first set of decoding parameters to a stored copy of the parity check results for the previous iteration 908. If the number of failed parity checks of the current iteration has not decreased by more than a threshold amount compared to the number of failed parity checks in the previous iteration (i.e. the number of parity checks has not significantly decreased between iterations) then the parity check comparison module 902 increments the counter 904 and notifies the non-progressing state-detection module 906 that the number of failed parity checks has not significantly decreased.

If however, the number of failed parity checks of the current iteration has decreased by more than the threshold amount compared to the number of failed parity checks in the previous iteration, the parity check comparison module 902 resets the counter 904 to ensure that only successive iterations, in which the number of failed parity checks does not significantly decrease, are counted. This avoids a false detection of a non-progressing state where the number of failed parity checks goes up temporarily and then quickly starts to go back down which has been observed quite often in real time practical systems.

Where the parity check results 208 are implemented as a bit vector comprising a bit for each parity check where a "1" indicates a failed parity check and a "0" indicates a successful parity check, the number of failed parity checks in the parity check results can be determined by counting the number of ones in the parity check results bit vector. Alternatively, the parity check results 208 for a codeword may be implemented as a sum of the parity checks for the bits of codewords.

The non-progressing state detection module 906 is configured to determine whether the first detection attempt (the decoding using the first set of decoding parameters) is in a non-progressing state based on the counter 904 value. For example, in some cases the non-progressing state detection module 906 may be configured to detect that the first decode attempt is in a non-progressing state when the counter 904 is greater than an iteration threshold. The iteration threshold may be empirically determined to achieve the fastest detection of a non-progressing state while still ensuring accurate detection of a non-progressing state.

If the non-progressing state detection module 906 detects that the first decode attempt is in a non-progressing state (e.g. the counter 904 is above the predetermined threshold) the non-progressing state detection module 906 obtains the relevant second set of decoding parameters 910 from memory and provides them to the LDPC decoder 202 as the new set of decoding parameters 604. The non-progressing state detection module 906 also transmits a control signal 606 to the LDPC decoder 202 instructing the LDPC decoder 202 to terminate the current decode attempt (i.e. the decoding using the first set of decoding parameters) and to restart a new decode attempt using the new set of decoding parameters provided.

As described above, instead of the control module 602 storing the new set of decoding parameters 910 and transmitting them to the LDPC decoder 202, in other examples the LDPC decoder 202 may store the second set of decoding parameters and the control module 602, via the control signal 606, may notify the LDPC decoder 202 which set of decoding parameters to use for the second decode attempt.

If the non-progressing state detection module 906 detects that the first decode attempt is not in a non-progressing state (e.g. the counter 904 is equal to or less than the predetermined threshold) then the non-progressing state detection module 906 may be configured to issue a control signal 606 to the LDPC decoder 202 instructing the LDPC decoder 202 to continue with the initial decode attempt—e.g. to complete the next iteration of the decoding using the first or primary set of decoding parameters.

Figure 10:
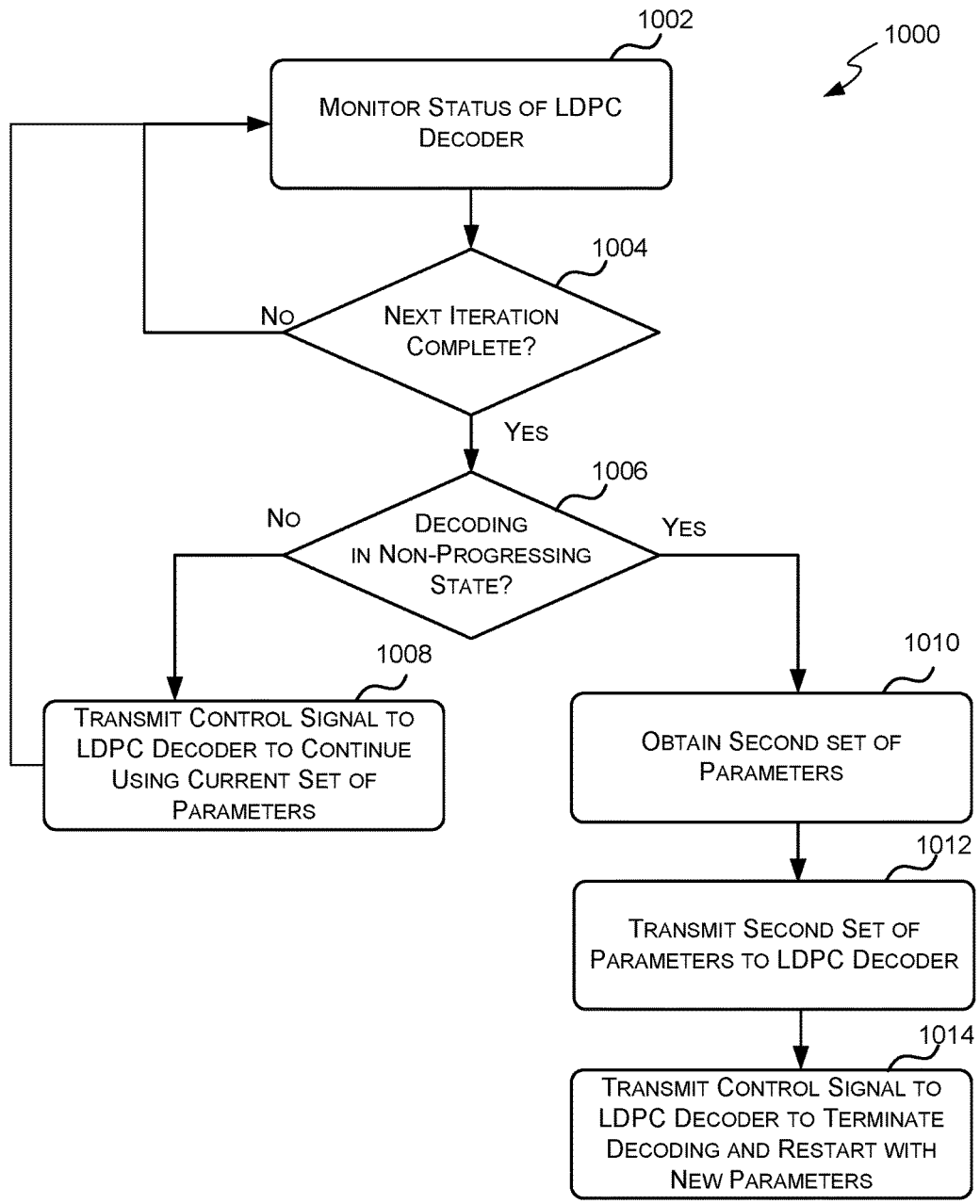
FIG. 10 is a flow chart of an example method for controlling operation of the LDPC decoder using the control module of FIG. 6.

Reference is now made to FIG. 10 which illustrates a method 1000 of controlling the operation of the LDPC decoder 202 using the control module 602 of FIG. 9. The method 1000 begins at block 1002 where the control module 602 monitors the status of the LDPC decoder 202. In some examples, the control module 602 may be configured to monitor an interrupt signal generated by the LDPC decoder when it completes an iteration of the decoding algorithm. However, other input and/or output ports or signals of the LDPC decoder may be monitored to determine the status of the LDPC decoder. The method 1000 then proceeds to block 1004.

At block 1004 the control module 602 determines whether the LDPC decoder has completed an iteration of the decoding algorithm. In some cases the control module 602 may determine that the next iteration of the decoding algorithm has been completed if it detects the monitored interrupt signal is high. If the control module 602 has determined that the next iteration of the decoding algorithm has been completed the method proceeds to block 1006. If however, the control module 602 has determined that the next iteration of the decoding algorithm has not been completed, then the method 1000 proceeds back to block 1002 where the control module 602 continues to monitor the status of the LDPC decoder 202.

At block 1006, the control module 602 determines whether the decoding using the first set of decoding parameters is in a non-progressing state. As described above, decoding is said to be in a non-decoding state when the estimated codeword (e.g. LLR values) is not improving after subsequent iterations. The quality of a codeword can be measured by the number of failed parity checks associated with the estimated codeword. Accordingly, in some cases the control module 602 may determine that the decode attempt is in a non-progressing state when the number of failed parity checks hasn't significantly decreased after a predetermined number of iterations. An example method for determining whether a decode attempt is in a non-progressing state is described with reference to FIG. 11.

If the control module 602 determines that the decoding is not in a non-progressing state (i.e. it is in a progressing state where the estimated codeword is improving after subsequent iterations) the method 1000 proceeds to block 1008 where the control module 602 transmits a control signal to the LDPC decoder indicating that the LDPC decoder should continue decoding the data block using the first or primary set of decoding parameters (e.g. it should execute the next iteration of the decoding). If, however, the control module 602 determines that the decoding is in a non-progressing state then the method 1000 proceeds to block 1010.

At block 1010, the control module 602 obtains the second set of decoding parameters, the second set of decoding parameters being different from the first set of decoding parameters. Once the second set of decoding parameters has been obtained, the method 1000 proceeds to block 1012.

At block 1012, the control module 602 transmits the second set of decoding parameters to the LDPC decoder 202. The method 1000 then proceeds to block 1014.

At block 1014, the control module 602 transmits a control signal to the LDPC decoder 202 to terminate the first decode attempt using the first set of decoding parameters and restart a new decode attempt using the second set of decoding parameters transmitted in block 1012. The method 1000 then ends.

In some cases, instead of the control module 602 storing and transmitting the second set of decoding parameters to the LDPC decoder, the LDPC decoder may store the second set of decoding parameters and the control signal transmitted by the control module 602 may notify the LDPC decoder 202 which set of decoding parameters to use when restarting the decoding.

Figure 11:
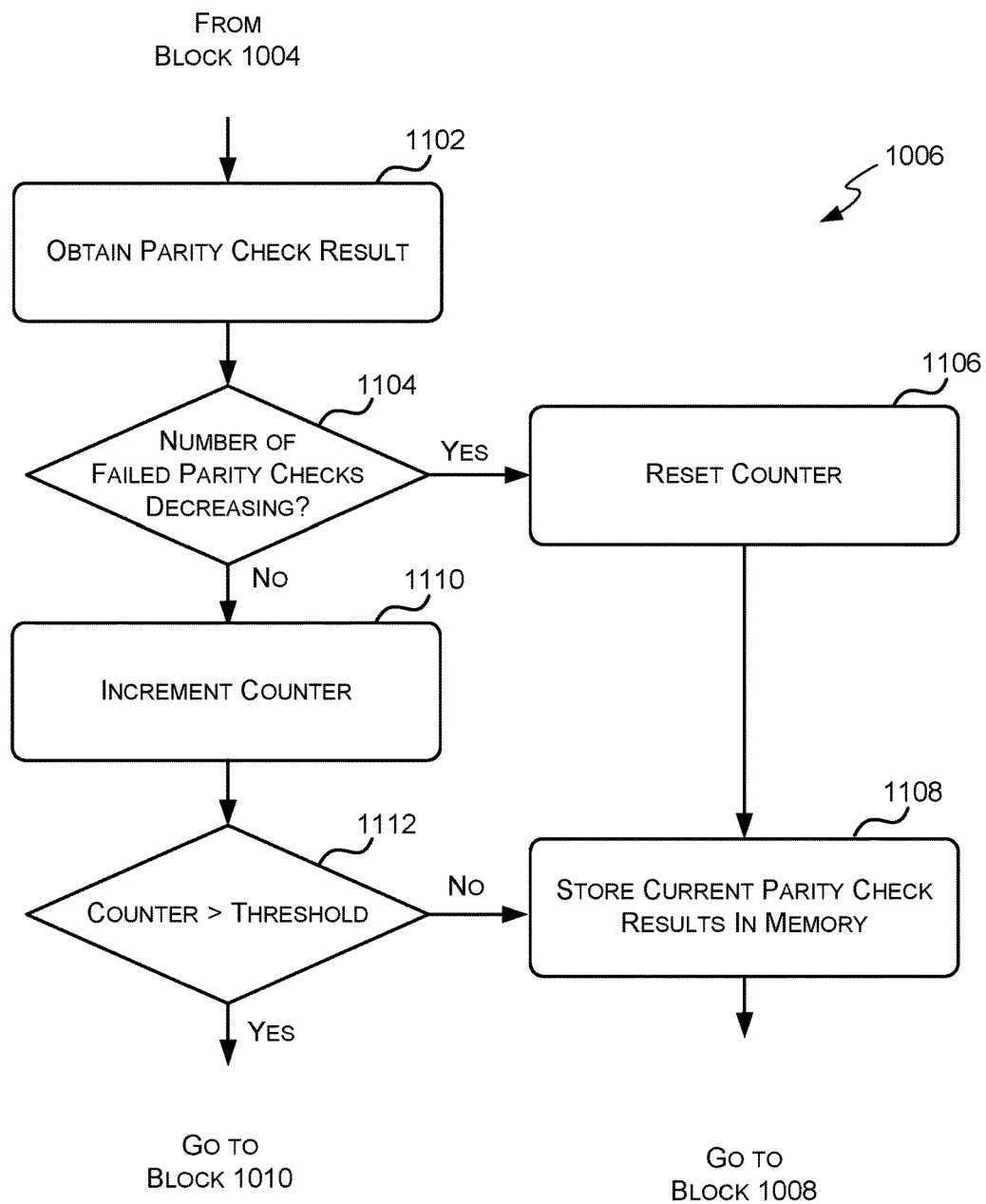
FIG. 11 is a flow chart of an example method for detecting decoding of an LDPC decoder is in a non-progressing state.

Reference is now made to FIG. 11 which illustrates a method of detecting when the decoding is in a non-progressing state as shown in method 1000 of FIG. 10 as block 1006. The method starts at block 1102 where, after determining that another iteration of the decoding algorithm has been completed, the control module 602 obtains the parity check results 208 corresponding to the completed iteration. The parity check results describe the outcome of each of the parity checks specified in the parity check matrix used for encoding. In some cases, the parity check results are implemented as a bit vector with a bit for each parity check or parity check equation. When a bit is set to one it may indicate that the corresponding parity check failed, and conversely when a bit is set to zero it may indicate that the corresponding parity check was successful. In other cases, the parity check results are implemented as a sum of the parity checks for the bits of the codeword. Once the parity check results for the most recent iteration are obtained the method proceeds to block 1104.

At block 1104 the control module 602 determines whether the number of failed parity checks is not significantly decreasing. The control module 602 may determine that the number of failed parity checks is not significantly decreasing by comparing the number of failed parity checks in the parity check results of the most recent iteration to the number of failed parity checks for the previous iteration. For example, if the number of failed parity checks for the most recent iteration is less than the number of failed parity checks for the previous iteration by more than a threshold amount then the number of failed parity checks is significantly decreasing. The threshold amount is set to be low, e.g. approximately 0.2% of the total number of bits. For example, where a codeword has 64,000 bits and the code rate is ½ the threshold may be set to 64. The threshold amount may be determined empirically through experimentation on real-time systems. In this way, the control module 602 looks for a plateau in the number of failed parity checks, but it is an approximately flat line (i.e. the number of failed parity checks is not significantly changing).

If, however, the number of failed parity checks for the most recent iteration is not less than the number of failed parity checks for the previous iterations by more than the threshold amount then the number of failed parity checks is not considered to be significantly decreasing. Where the parity check results are implemented as a bit vector, determining the number of failed parity checks may comprise counting the number of ones in the parity check result bit vector.

The LDPC decoder 202 runs every iteration and will make changes to the LLRs, which in turn will affect the parity check results, and hence will affect the total number of failed parity checks. Conceptually, if the LDPC decoder 202 is stuck in a local minimum of total failed parity checks, the decoder will be bouncing around the values around the bottom of this minimum, but cannot get out of it to progress further, e.g. to reduce the number of failed parity checks to zero. Experimental results have shown that whilst the LDPC decoder is around the local minimum, the exact number of failed parity checks is unlikely to remain completely static, but it will not tend to vary by a lot. For example, a graph of the number of failed parity checks when the decoder is near to the local minimum may look like a noisy flat line. So, a maximum increase and decrease allowed for the number of failed parity checks is set (i.e. a threshold is set) which may for example be 0.2% as mentioned above. If the change in the number of failed parity checks does not exceed this threshold after an iteration, then an increment is made to the counter of the number of consecutive iterations for which the number of failed parity checks has not significantly decreased. Otherwise the counter is reset.

Accordingly, if it is determined that the number of failed parity checks has significantly decreased from the previous iteration then the method proceeds to block 1106 where the counter is reset. As described above, the counter is reset to ensure that only consecutive iterations in which there was no significant decrease in the number of failed parity checks are included in the count. Specifically, each time the number of failed parity checks decreases more than the threshold amount the counter is reset. Once the counter has been reset the method proceeds to block 1108 where the parity check result for the most recent iteration is stored in memory as the parity check results for the previous iteration. The stored parity check result is then used after completion of the next iteration to determine whether there was a significant decrease in the number of failed parity checks in the next iteration. The method then proceeds to block 1008 of method 1000 where the control module 602 sends a control signal to the LDPC decoder to continue decoding using the first set of decoding parameters.

If it is determined that the number of failed parity checks has not significantly decreased from the previous iteration then the method proceeds to block 1110 where the counter is incremented. Once the counter has been incremented, the method 1100 proceeds to block 1112 where it is determined whether or not the counter exceeds an iteration threshold. If the counter exceeds the iteration threshold then then the number of failed parity checks has been steady or increasing for a significant amount of time and thus it is safe to declare that the decoding is in a non-progressing state. If it is determined that the counter exceeds the iteration threshold then the method proceeds to block 1010 of the method 1000 of FIG. 10 where the control module 602 outputs a control signal telling the LDPC decoder to cease decoding using the first set of decoding parameters and restart decoding using a second, different, set of decoding parameters.

The term 'processor' and 'computer' are used herein to refer to any device, or portion thereof, with processing capability such that it can execute instructions. The term 'processor' may, for example, include central processing units (CPUs), graphics processing units (GPUs or VPUs), physics processing units (PPUs), radio processing units (RPUs), digital signal processors (DSPs), general purpose processors (e.g. a general purpose GPU), microprocessors, any processing unit which is designed to accelerate tasks outside of a CPU, etc. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of decoding a low density parity check (LDPC) encoded data block, the method comprising:
   iteratively decoding, at an LDPC decoder, the LDPC encoded data block using a first set of decoding parameters;
   determining whether the iterative decoding of the LDPC encoded data block using the first set of decoding parameters has reached a non-progressing state; and in response to determining that the iterative decoding of the LDPC encoded data block using the first set of decoding parameters has reached a non-progressing state, terminating the iterative decoding of the LDPC encoded data block using the first set of decoding parameters, and restarting iterative decoding, at the LDPC decoder, of the LDPC encoded data block using a second set of decoding parameters, the second set of decoding parameters being different from the first set of decoding parameters.

2. The method of claim 1, wherein determining whether the iterative decoding of the LDPC encoded data block using the first set of decoding parameters has reached a non-progressing state comprises monitoring parity check results generated in each iteration of the iterative decoding of the LDPC encoded data block using the first set of decoding parameters, wherein the parity check results for a particular iteration indicate a number of failed parity checks for that iteration.

3. The method of claim 2, wherein determining whether the iterative decoding of the LDPC encoded data block using the first set of decoding parameters has reached a non-progressing state further comprises determining whether the number of failed parity checks has failed to decrease by more than a threshold amount for a predetermined number of iterations of the iterative decoding of the LDPC encoded data block using the first set of decoding parameters.

4. The method of claim 3, wherein determining whether the number of failed parity checks has failed to decrease by more than a threshold amount for a predetermined number of iterations of the iterative decoding of the LDPC encoded data block using the first set of decoding parameters comprises, for each iteration:
comparing the number of failed parity checks of that iteration to the number of failed parity checks of a previous iteration;
in response to determining that the number of failed parity checks of that iteration is not less than the number of failed parity checks of the previous iteration by more than the threshold amount, incrementing a counter;
in response to determining that the number of failed parity checks of that iteration is less than the number of failed parity checks of the previous iteration by more than the threshold amount, clearing the counter;
determining whether a value of the counter is larger than the predetermined number of iterations; and
in response to determining that the value of the counter is larger than the predetermined number of iterations, determining that the number of failed parity checks has failed to decrease by more than the threshold amount for a predetermined number of iterations of the iterative decoding of the LDPC encoded data block using the first set of decoding parameters.

5. The method of claim 1, wherein restarting iterative decoding of the LDPC encoded data block using the second set of decoding parameters comprises obtaining the LDPC encoded data block at the LDPC decoder and iteratively decoding the LDPC encoded data block at the LDPC decoder using the second set of decoding parameters.

6. The method of claim 1, wherein a predicted codeword for the LDPC encoded data block is generated for each iteration of the iterative decoding of the LDPC encoded data block using the first set of decoding parameters; and a non-progressing state occurs when a quality of the predicted codeword does not improve after a predetermined number of subsequent iterations.

7. The method of claim 1, wherein the first and second sets of decoding parameters each comprise an offset and a scale that is used by the LDPC decoder to adjust one or more inputs to the LDPC decoder.

8. The method of claim 1, further comprising terminating the iterative decoding of the LDPC encoded data block using the second set of decoding parameters when a predetermined number of iterations of the iterative decoding of the LDPC encoded data block using the second set of decoding parameters has been performed.

9. The method of claim 8, wherein the predetermined number of iterations is equal to a maximum number of iterations for decoding the LDPC encoded data block less a number of iterations performed during the iterative decoding of the LDPC encoded data block using the first set of decoding parameters.

10. A system configured to decode a low density parity check (LDPC) encoded data block, the system comprising
an LDPC decoder configured to iteratively decode the LDPC encoded data block using a first set of decoding parameters; and
a control module configured to:
determine whether the iterative decoding of the LDPC encoded data block using the first set of decoding parameters has reached a non-progressing state; and
in response to determining that the iterative decoding of the LDPC encoded data block using the first set of decoding parameters has reached a non-progressing state, provide an indication to the LDPC decoder that the iterative decoding of the LDPC encoded data block using the first set of decoding parameters has reached a non-progressing state;
wherein the LDPC decoder is further configured to, in response to receiving the indication, terminate the iterative decoding of the LDPC encoded data block using the first set of decoding parameters, and restart an iterative decode of the LDPC encoded data block using a second set of decoding parameters, the second set of decoding parameters being different from the first set of decoding parameters.

11. The system of claim 10, wherein the control module is configured to determine whether the iterative decoding of the LDPC encoded data block using the first set of decoding parameters has reached a non-progressing state based on parity check results generated in each iteration of the iterative decoding of the LDPC encoded data block using the first set of decoding parameters, wherein the parity check results for a particular iteration indicate a number of failed parity checks for that iteration.

12. The system of claim 11, wherein the control module is configured to determine whether the iterative decoding of the LDPC encoded data block using the first set of decoding parameters has reached a non-progressing state by determining whether the number of failed parity checks has failed to decrease by more than a threshold amount for a predetermined number of iterations of the iterative decoding of the LDPC encoded data block using the first set of decoding parameters.

13. The system of claim 12, wherein the control module is configured to determine whether the number of failed parity checks has failed to decrease by more than a threshold amount for a predetermined number of iterations of the iterative decoding of the LDPC encoded data block using the first set of decoding parameters by, for each iteration:
comparing the number of failed parity checks of that iteration to the number of failed parity checks of a previous iteration;

in response to determining that the number of failed parity checks of that iteration is not less than the number of failed parity checks of the previous iteration by more than a threshold amount, incrementing a counter;

in response to determining that the number of failed parity checks of that iteration is less than the number of failed parity checks of the previous iteration by more than a threshold amount, clearing the counter;

determining whether a value of the counter is larger than the predetermined number of iterations; and in response to determining that the value of the counter is larger than the predetermined number of iterations, determining that the number of failed parity checks has failed to decrease by more than the threshold amount for a predetermined number of iterations of the iterative decoding of the LDPC encoded data block using the first set of decoding parameters.

14. The system of claim 10, wherein the LDPC decoder is configured to restart iterative decoding of the LDPC encoded data block using the second set of decoding parameters by obtaining the LDPC encoded data block at the LDPC decoder and iteratively decoding the LDPC encoded data block at the LDPC decoder using the second set of decoding parameters.

15. The system of claim 10, wherein the LDPC decoder is configured to a generate a predicted codeword for the LDPC encoded data block for each iteration of the iterative decoding of the LDPC encoded data block using the first set of decoding parameters, and a non-progressing state occurs when a quality of the predicted codeword does not improve after a predetermined number of subsequent iterations.

16. The system of claim 10, wherein the LDPC decoder is further configured to terminate the iterative decoding of the LDPC encoded data block using the second set of decoding parameters when a predetermined number of iterations of the iterative decoding of the LDPC encoded data block using the second set of decoding parameters has been performed.

17. The system of claim 16, wherein the predetermined number of iterations is equal to a maximum number of iterations for decoding the LDPC encoded data block less a number of iterations performed during the iterative decoding of the LDPC encoded data block using the first set of decoding parameters.

18. The system of claim 10, wherein the control module is integrated with the LDPC decoder.

19. A non-transitory computer readable storage medium having stored thereon computer executable program code that when executed causes at least one processor to:

iteratively decode an LDPC encoded data block using a first set of decoding parameters;

determine whether the iterative decoding of the LDPC encoded data block using the first set of decoding parameters has reached a non-progressing state; and in response to determining that the iterative decoding of the LDPC encoded data block using the first set of decoding parameters has reached a non-progressing state, terminate the iterative decoding of the LDPC encoded data block using the first set of decoding parameters, and restart iterative decoding of the LDPC encoded data block using a second set of decoding parameters, the second set of decoding parameters being different from the first set of decoding parameters.

20. The method of claim 1, wherein determining whether the iterative decoding of the LDPC encoded data block using the first set of decoding parameters has reached a non-progressing state comprises monitoring progress of the decoding of the LDPC encoded data block using the first set of decoding parameters.

* * * * *